United States Patent
Huang et al.

(10) Patent No.: US 9,867,303 B1
(45) Date of Patent: Jan. 9, 2018

(54) MODULAR CIRCUIT DEVICE

(71) Applicant: CUBExUS Limited, New Taipei (TW)

(72) Inventors: Sheng-Che Huang, New Taipei (TW); Yu-Tse Liu, New Taipei (TW); Wei-Han Hu, New Taipei (TW); Chien-Hung Lee, New Taipei (TW)

(73) Assignee: CUBEXUS LIMITED, New Taipei (TW)

( * ) Notice: Subject to any disclaimer, the term of this patent is extended or adjusted under 35 U.S.C. 154(b) by 0 days.

(21) Appl. No.: 15/390,034

(22) Filed: Dec. 23, 2016

(51) Int. Cl.
*H05K 5/00* (2006.01)
*H05K 7/02* (2006.01)
*H01R 12/52* (2011.01)
*H05K 1/14* (2006.01)

(52) U.S. Cl.
CPC .......... *H05K 7/023* (2013.01); *H01R 12/523* (2013.01); *H05K 1/144* (2013.01); *H05K 2201/042* (2013.01); *H05K 2201/10189* (2013.01)

(58) Field of Classification Search
CPC ............. H05K 7/023; H05K 2201/042; H05K 2201/10189; H05K 1/144; H01R 12/523
USPC ........................................................ 361/730
See application file for complete search history.

(56) References Cited

U.S. PATENT DOCUMENTS

| | | | | |
|---|---|---|---|---|
| D732,475 S | * | 6/2015 | Bdeir | H01R 9/03 D13/146 |
| 2011/0059652 A1 | * | 3/2011 | Hoyack | H01R 12/91 439/607.31 |
| 2011/0256740 A1 | * | 10/2011 | Naito | H01R 12/7082 439/65 |
| 2013/0343025 A1 | | 12/2013 | Bdeir | |
| 2016/0192492 A1 | | 6/2016 | Huang et al. | |

* cited by examiner

*Primary Examiner* — Hung S Bui
(74) *Attorney, Agent, or Firm* — Chun-Ming Shih

(57) ABSTRACT

A modular circuit device is provided with a first circuit module including a circuit board and first and first bridge elements. The circuit board includes a substrate, a female header, and a pin header. The substrate includes a first projection at one end with the female header disposed thereon, and a second projection at the other end with the pin header disposed thereon. The first bridge member includes a bottom recess, two cavities on two sides of the bottom recess respectively, and a socket on one end of the first bridge member. The first bridge element includes a bottom recess, two cavities on two sides of the bottom recess respectively, and a projecting element at the other end of the first bridge element. The first projection is disposed in the cavities of the first bridge member. The second projection is in the cavities of the first bridge element.

13 Claims, 15 Drawing Sheets

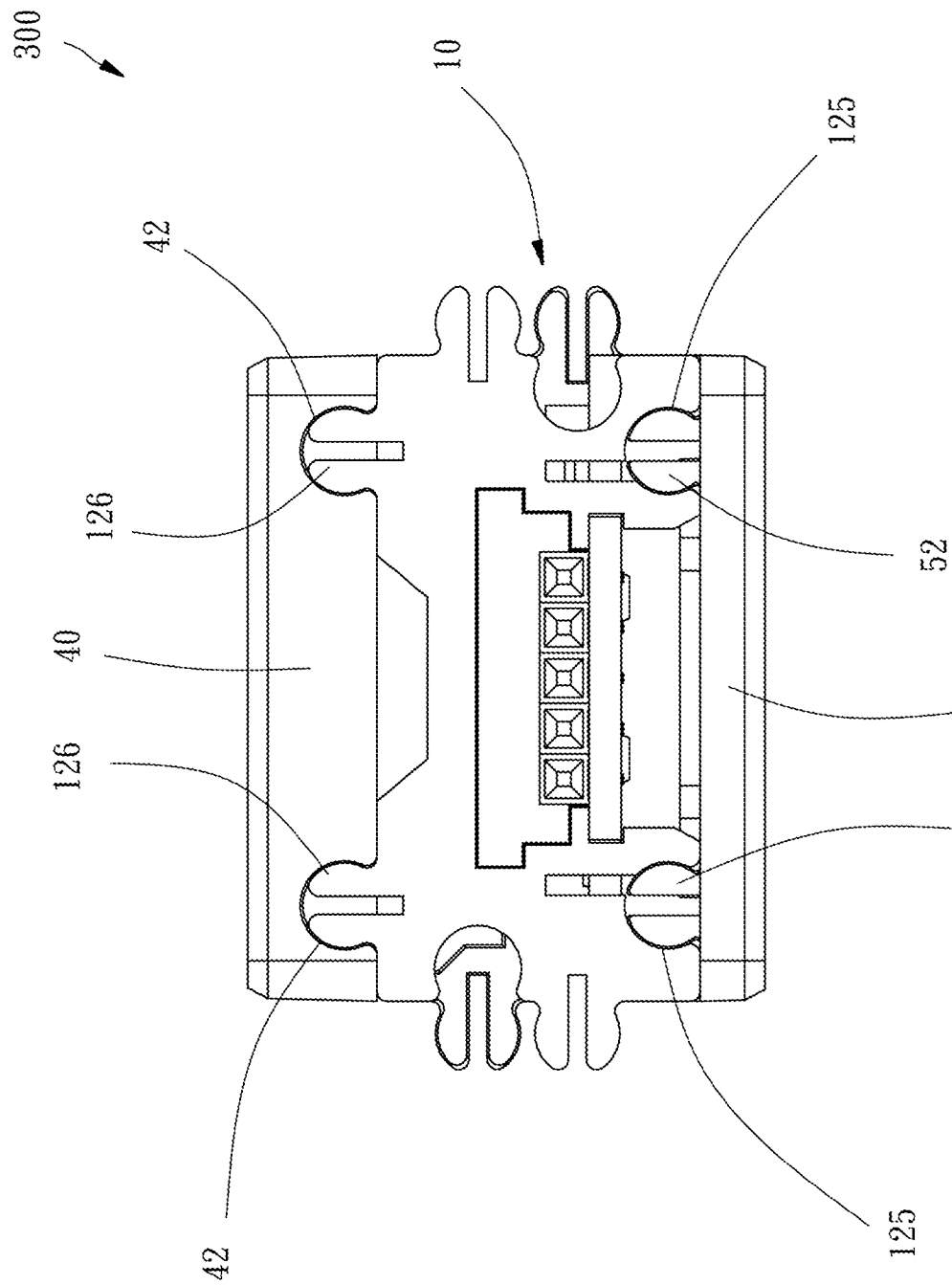

MODULAR CIRCUIT DEVICE

BACKGROUND OF THE INVENTION

1. Field of the Invention

The invention relates to circuits and more particularly to a modular circuit device, a plurality of the modular circuit devices being capable of assembled in one of a plurality of different configurations.

2. Description of Related Art

U.S. Publication Number 2013/0343025 A1 entitled "modular electronic building systems with magnetic interconnections and methods of using the same" discloses an electrical connector includes a housing defining a side surface, an electrical conductor supported by the housing and including an engagement portion proximate the side surface of the housing. The engagement portion is adapted to engage another electrical conductor of another electrical connector. The connector also includes a magnet supported by the housing proximate the side surface of the housing, a projection extending from the side surface of the housing, and a receptacle defined in the side surface of the housing.

However, the Publication has drawbacks including being subject to separation due to small magnetic force, being impossible of stacking, and limited applications.

U.S. Publication Number 2016/0192492 A1 entitled "circuit module system" discloses first and second circuit modules. The first circuit module includes a first circuit board and a first connecting housing including a first base connected to a side of the first circuit board and at least one first conductor. A top surface of the first base forms a fillister connecting to outside. The first conductor is clamped on the first base and electrically connects the first circuit board to outside. The second circuit module includes a second circuit board and a second connecting housing including a second base connected to a side of the second circuit board and at least one second conductor. A protruding part protrudes from an outer side of the second base. The second conductor is clamped on the second base and electrically connects the second circuit board to outside.

However, the Publication has drawbacks including excessive components due to the mounting of the conductors on the base consisting of two complimentary shells, greatly increased manufacturing cost, increased assembly steps and difficulties, poor electrical contact between the base and the circuit board due to relative movement of the base to the circuit board, and being subject to wear.

Notwithstanding the prior art, the invention is neither taught nor rendered obvious thereby.

SUMMARY OF THE INVENTION

It is desirable to provide a modular circuit device which addresses the above described problems associated with the prior art.

It is therefore an object of the invention to provide a modular circuit device comprising a first circuit module including a circuit board, a first bridge member, and a first bridge element; wherein the circuit board includes a substrate, a female header, and a pin header; wherein the substrate includes a first projection at a first end with the female header disposed thereon, and a second projection at a second end with the pin header disposed thereon; wherein the first bridge member is integrally formed of a non-conductive substrate; wherein the first bridge member includes a recess on a bottom, two cavities on two sides of the recess respectively, and a socket on a first end of the first bridge member; wherein the first bridge element is integrally formed of a non-conductive substrate; wherein the first bridge element includes a recess on a bottom, two cavities on two sides of the recess respectively, and a projecting element at the second end of the first bridge element; and wherein the first projection of the substrate is disposed in the cavities of the first bridge member, the female header of the circuit board is disposed in the recess of the first bridge member, the second projection of the substrate is disposed in the cavities of the first bridge element, and the pin header of the circuit board is disposed in the recess of the first bridge element.

Preferably, the substrate is a printed circuit board having electronic components embedded therein, and wherein the first projection is at the first end of the substrate, the second projection is at a second end of the substrate, the female header is electrically connected to the substrate, and the pin header is electrically connected to the substrate.

Preferably, the substrate further comprises at least one first through hole and at least one second through hole, wherein the first bridge member further comprises at least one peg disposed in the recess thereof and inserted into the first through hole, and wherein the first bridge element further comprises at least one peg disposed in the recess thereof and inserted into the second through hole.

Preferably, the first bridge member further comprises two grooves on two sides of a bottom thereof respectively, and two protrusions on two sides of a top thereof respectively; wherein the first bridge element further comprises two grooves on two sides of a bottom thereof respectively, and two protrusions on a top thereof respectively; and wherein the grooves of the first and first bridge elements of a first one of the first circuit modules are placed on the protrusions of the first and first bridge elements of a second one of the first circuit modules thereunder when the first and second ones of the first circuit modules are stacked.

Preferably, there is further provided a parallelepiped cover including a central through hole and four grooves on bottoms of four corners respectively, the grooves being configured to place on the protrusions of the first bridge member and the protrusions of the first bridge element respectively.

Preferably, there is further provided a parallelepiped base including a central through hole and four projections on tops of four corners respectively, the projections being configured to insert into the grooves of the first bridge member and the grooves of the first bridge element respectively.

Preferably, the first bridge member further comprises a first trough on one side, a protuberance on one side above the first trough, a second trough on the other side, and a projecting member on the other side under the second trough; wherein the first bridge element further comprises a first trough on one side, a protuberance on one side under the first trough thereof, a second trough on the other side, and a projecting member on the other side above the second trough thereof; and wherein the protuberance and the projecting member of a first one of the first circuit modules are disposed in the first and second troughs of a second one of the first circuit modules respectively when the first and second ones of the first circuit modules are assembled in a front to rear arrangement.

Preferably, there are further provided a second circuit module including a circuit board, a first bridge member, and a first bridge element; wherein the circuit board includes a substrate, a female header, and a pin header; wherein the substrate includes a first projection at a first end with the female header disposed thereon, and a second projection at the second end with the pin header disposed thereon; wherein the first bridge member includes a recess on a bottom, two cavities on two sides of the recess respectively, and a socket on a first end of the first bridge member; wherein the first bridge element includes a recess on a bottom, two cavities on two sides of the recess respectively, and a projecting element at the second end of the first bridge element; wherein the first projection of the substrate is disposed in the cavities of the first bridge member, the female header of the circuit board is disposed in the recess of the first bridge member, the second projection of the substrate is disposed in the cavities of the first bridge element, and the pin header of the circuit board is disposed in the recess of the first bridge element; and wherein the protrusions of the first circuit module are inserted into the grooves of the second circuit module and the protrusions of the first circuit module are inserted into the grooves of the second circuit module, thereby disposing the second circuit module on the first circuit module; and an electrical connection assembly including a cable; a first conductive assembly including a conductive board electrically connected to a first end of the cable, a projecting part at a first end of the conductive board, and a female header on the projecting part and electrically connected to the conductive board; a second conductive assembly including a conductive board electrically connected to a second end of the cable, a projecting part at a first end of the conductive board thereof, and a pin header on the projecting part thereof and electrically connected to the conductive board thereof; a second bridge member mounted on the first conductive assembly; and a second bridge element wherein the projecting part and the female header of the first conductive assembly are disposed in a recess of the second bridge member with two sides of the projecting part disposed in two cavities of the second bridge member respectively; wherein the projecting part and the pin header of the second conductive assembly are disposed in a recess of the second bridge element; the protrusions of the first circuit module are inserted into the grooves of the second circuit module and the protrusions of the first circuit module are inserted into the grooves of the second circuit module, thereby fastening the first circuit module and the second circuit module together; wherein a projecting element of the second bridge element is inserted into the socket of the first circuit module; wherein a projecting element of the second circuit module is inserted into a socket of the second bridge member to fasten the electrical connection assembly, the first circuit module, and the second circuit module together; wherein the pin header of the second conductive assembly is inserted into the female header of the first circuit module; and wherein the pin header of the second circuit module is inserted into the female header of the first conductive assembly to electrically interconnect the electrical connection assembly, the first circuit module, and the second circuit module.

Preferably, the first conductive assembly has electronic components embedded therein, the projecting part of the first conductive assembly are disposed in two cavities of the second bridge member respectively, and the female header of the first conductive assembly is disposed on the projecting part of the first conductive assembly and is electrically connected to the first conductive assembly; and wherein the second conductive assembly has electronic components embedded therein, the projecting part of the second conductive assembly are disposed in two cavities of the second bridge element respectively, and the female header of the first conductive assembly is disposed on the projecting part of the second conductive assembly and is electrically connected to the second conductive assembly.

Preferably, the first conductive assembly includes at least one first positioning hole, and the second bridge ember includes at least one peg inserted into the at least one first positioning hole respectively; and wherein the second conductive assembly includes at least one second positioning hole, and the second bridge element includes at least one peg inserted into the at least one second positioning hole respectively.

Preferably, there is further provided an electrical connection assembly including a cable; a first conductive assembly including a conductive board electrically connected to a first end of the cable, a projecting part at a first end of the conductive board, and a female header on the projecting part and electrically connected to the conductive board; a second conductive assembly including a conductive board electrically connected to a second end of the cable, a projecting part at a first end of the conductive board thereof, and a pin header on the projecting part thereof and electrically connected to the conductive board thereof; a second bridge member mounted on the first conductive assembly; and a second bridge element wherein the projecting part and the female header of the first conductive assembly are disposed in a recess of the second bridge member with two sides of the projecting part disposed in two cavities of the second bridge member respectively; wherein the projecting part and the pin header of the second conductive assembly are disposed in a recess of the second bridge element; the protrusions of the first circuit module are inserted into the grooves of the second circuit module and the protrusions of the first circuit module are inserted into the grooves of the second circuit module, thereby fastening the first circuit module and the second circuit module together; wherein a projecting element of the second bridge element is inserted into the socket of the first circuit module; wherein a projecting element of the second circuit module is inserted into a socket of the second bridge member to fasten the electrical connection assembly, the first circuit module, and the second circuit module together; wherein the pin header of the second conductive assembly is inserted into the female header of the first circuit module; and wherein the pin header of the second circuit module is inserted into the female header of the first conductive assembly to electrically interconnect the electrical connection assembly, the first circuit module, and the second circuit module.

Preferably, the number of the first circuit modules is two and each of the first circuit modules includes a circuit board, a first bridge member, and a first bridge element; wherein the circuit board includes a substrate, a female header, and a pin header; wherein the substrate includes a first projection at a first end with the female header disposed thereon, and a second projection at a second end with the pin header disposed thereon; wherein the first bridge member is integrally formed of a non-conductive substrate; wherein the first bridge member includes a recess on a bottom, two cavities on two sides of the recess respectively, and a socket on a first end of the first bridge member; wherein the first bridge element is integrally formed of a non-conductive substrate; wherein the first bridge element includes a recess on a bottom, two cavities on two sides of the recess respectively, and a projecting element at a second end of the first bridge element; and wherein the first projection of the substrate is disposed in the cavities of the first bridge member, the female header of the circuit board is disposed in the recess of the first bridge member, the second projection of the substrate is disposed in the cavities of the first bridge element, and the pin header of the circuit board is disposed in the recess of the first bridge element; there is further provided an electrical connection assembly including a cable; a first conductive assembly including a conductive board electrically connected to a first end of the cable, a projecting part at a first end of the conductive board, and a female header on the projecting part and electrically connected to the conductive board; a second conductive assembly including a conductive board electrically connected to a second end of the cable, a projecting part at a first end of the conductive board thereof, and a pin header on the projecting part thereof and electrically connected to the conductive board thereof; a second bridge member mounted on the first conductive assembly; and a second bridge element wherein the projecting part and the female header of the first conductive assembly are disposed in a recess of the second bridge member with two sides of the projecting part disposed in two cavities of the second bridge member respectively; wherein the projecting part and the pin header of the second conductive assembly are disposed in a recess of the second bridge element; the protrusions of the first circuit module are inserted into the grooves of the second circuit module and the protrusions of the first circuit module are inserted into the grooves of the second circuit module, thereby fastening the first circuit module and the second circuit module together; wherein a projecting element of the second bridge element is inserted into the socket of the first circuit module; wherein a projecting element of the second circuit module is inserted into a socket of the second bridge member to fasten the electrical connection assembly, the first circuit module, and the second circuit module together; wherein the pin header of the second conductive assembly is inserted into the female header of the first circuit module; and wherein the pin header of the second circuit module is inserted into the female header of the first conductive assembly to electrically interconnect the electrical connection assembly, the first circuit module, and the second circuit module.

Preferably, the socket of a first one of the first circuit modules is placed on the projecting element of a second one of the first circuit modules, and the pin header of the first one of the first circuit modules is inserted into the female header of the second one of the first circuit modules when the first and second ones of the first circuit modules assembled side by side.

The invention has the following advantages: The female header, the pin header, the first bridge member and the first bridge element are disposed on the substrate of the circuit board. Small relative movement or displacement of the first bridge member or the first bridge element does not adversely affect the positioning of both the female header and the pin header on the circuit board and the electrical connection of both the female header and the pin header to the circuit board. This ensures a reliable electrical connection of the modular circuit device of the invention. Both the first bridge member and the first bridge element are integrally formed. Both the female header and the pin header are provided on the substrate. This can decrease both the number of components and the manufacturing cost. An easy and fast assembly is made possible. Finally, use is convenient.

BRIEF DESCRIPTION OF THE DRAWINGS

These and other features and advantages of the various embodiments disclosed herein will be better understood with respect to the following description and drawings, in which like numbers refer to like parts throughout, and in which:

FIG. 13 is a side elevation of the modular circuit device shown in FIG. 11.

DETAILED DESCRIPTION OF THE INVENTION

Figure 1:
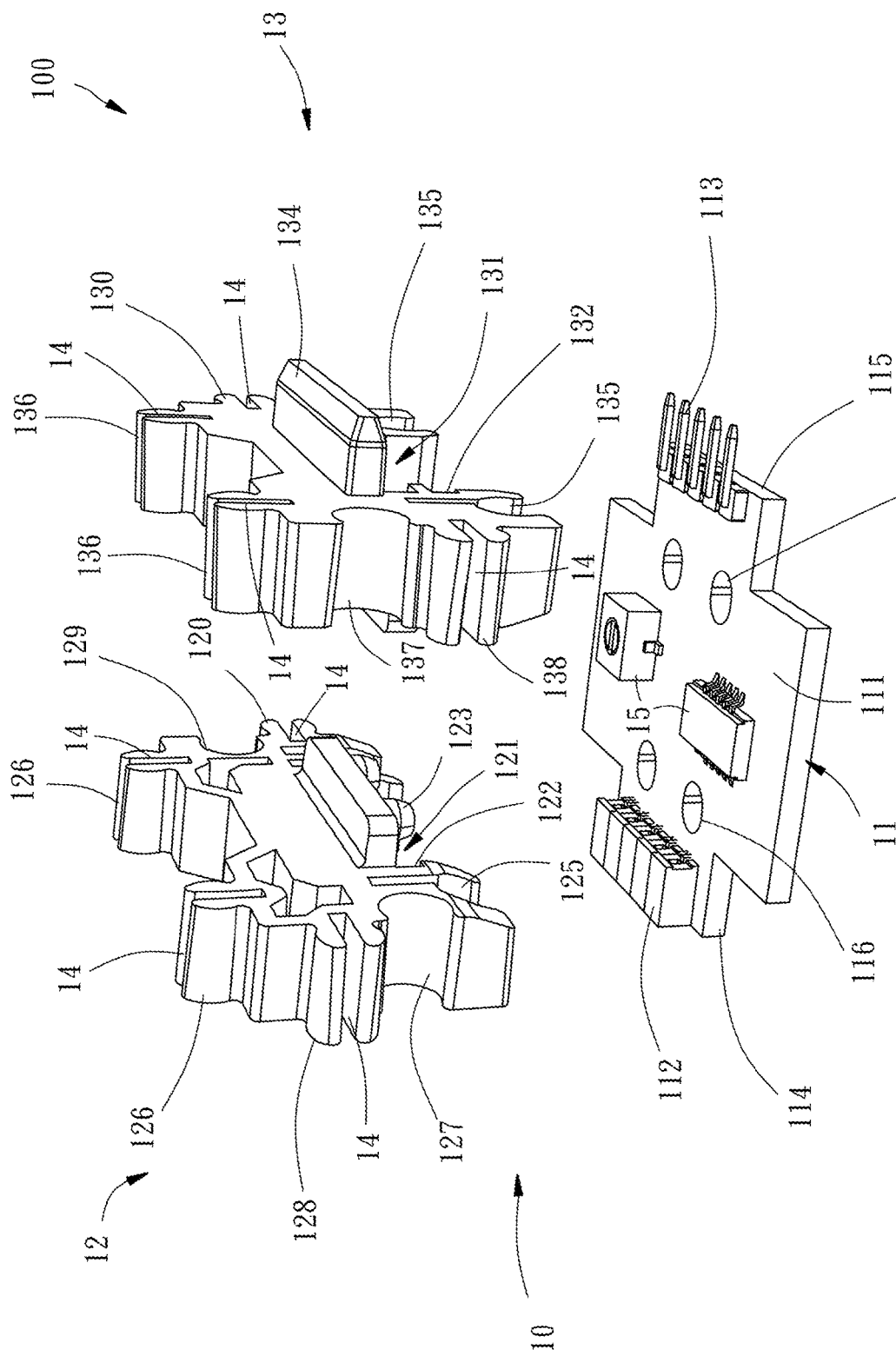
FIG. 1 is an exploded view of a modular circuit device according to a first preferred embodiment of the invention.
Figure 2:
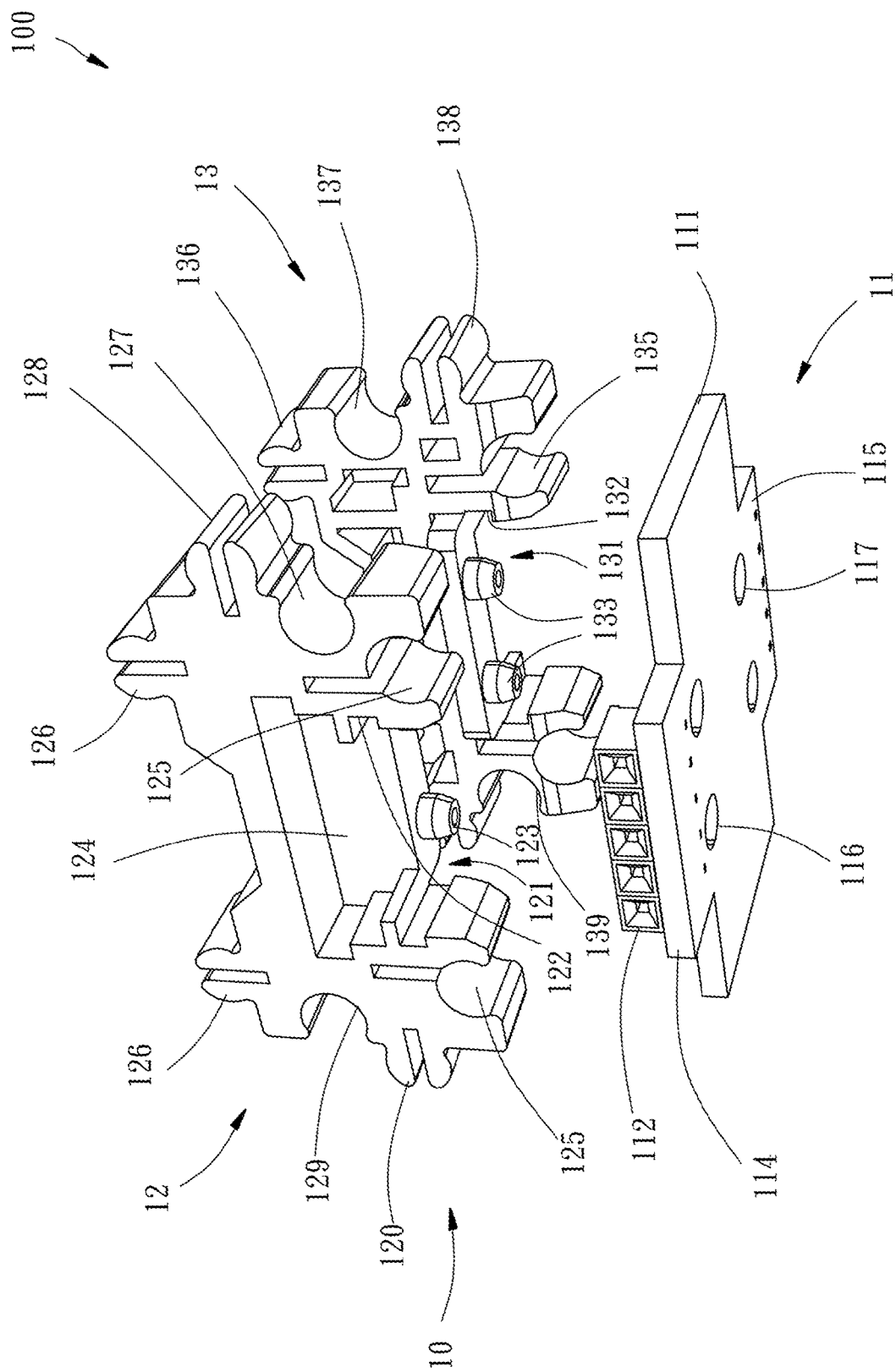
FIG. 2 is another exploded view of the modular circuit device.
Figure 3:
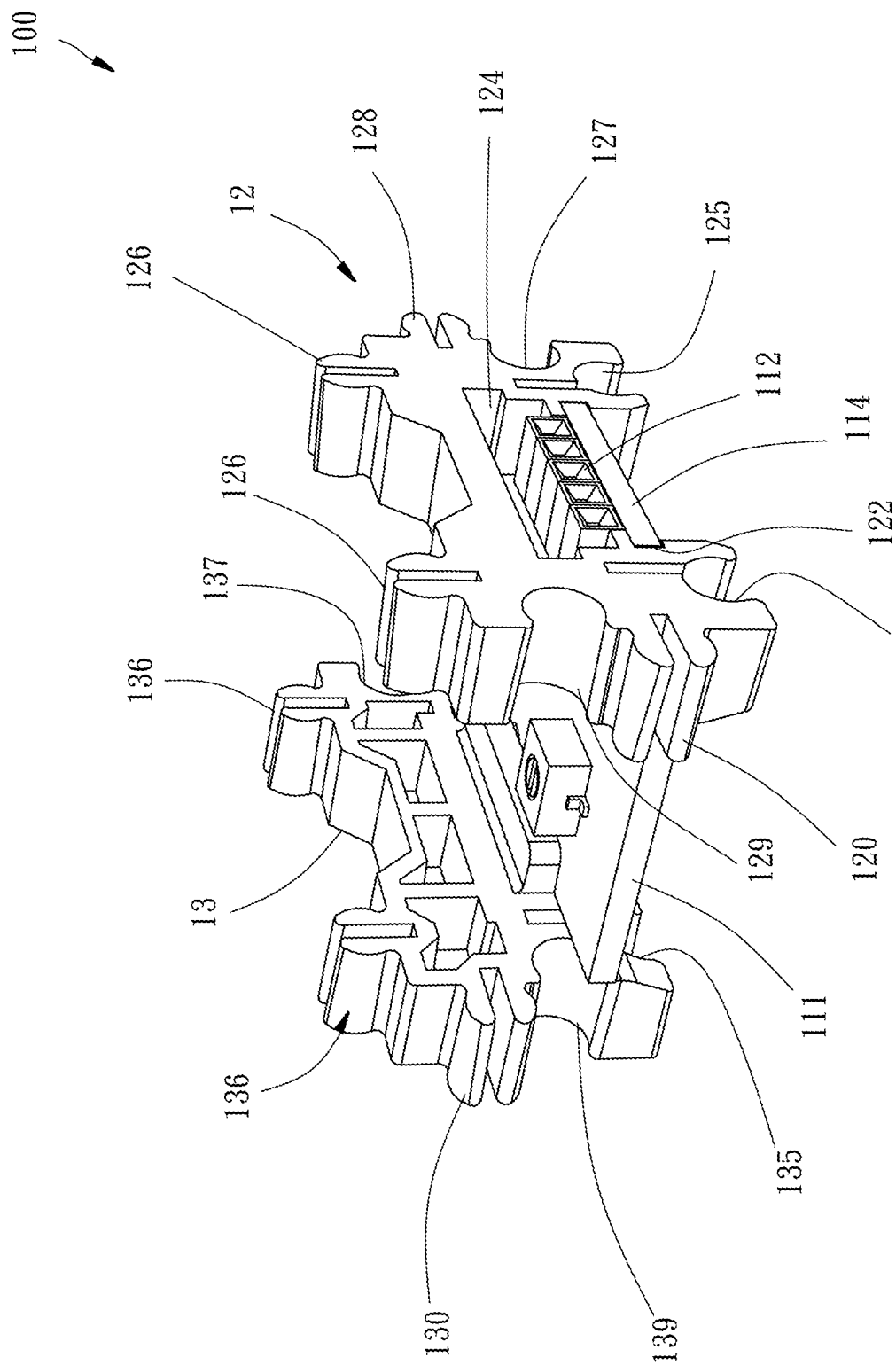
FIG. 3 is a perspective view of the assembled modular circuit device.
Figure 4:
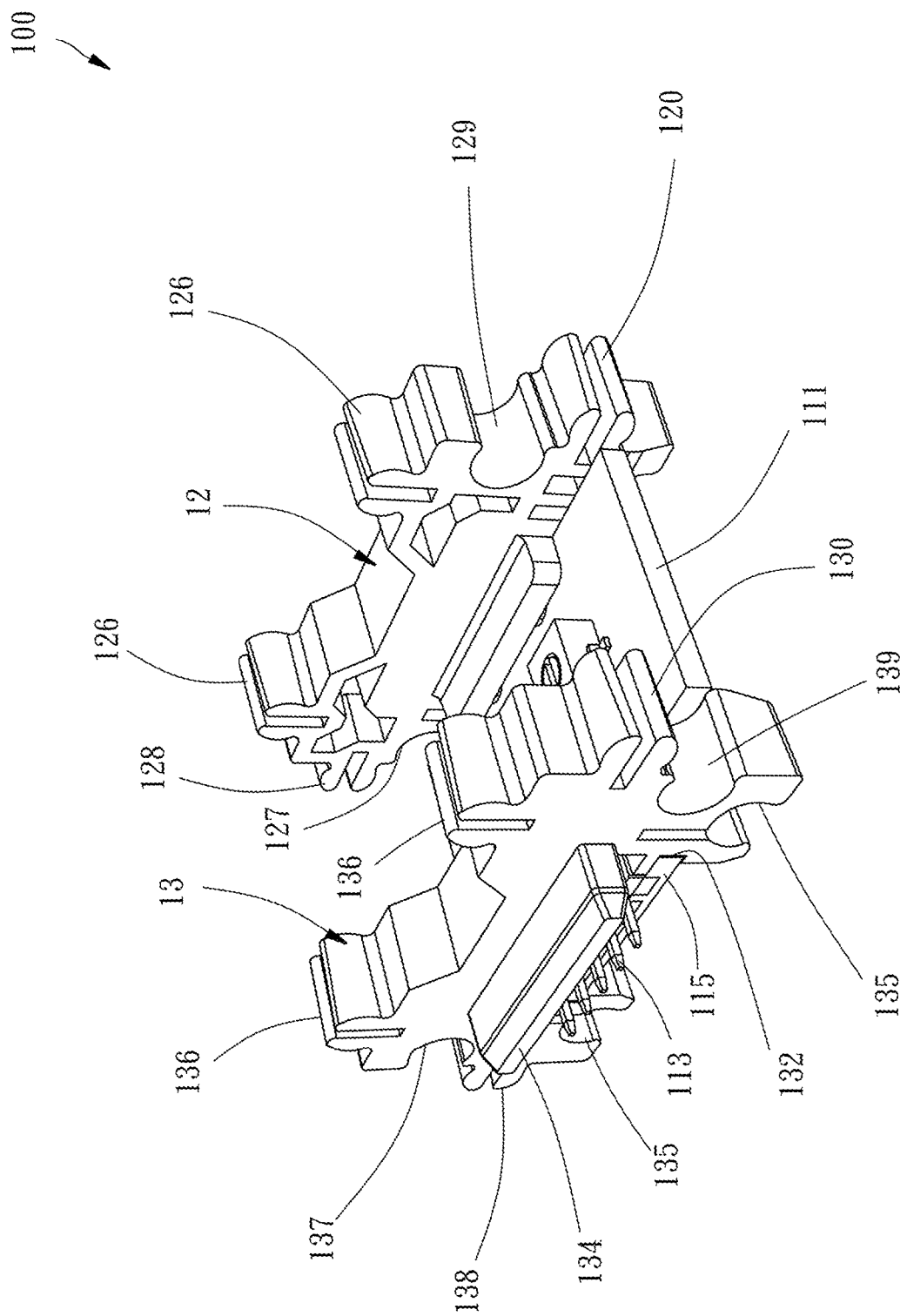
FIG. 4 is another perspective view of the assembled modular circuit device.

Referring to FIGS. 1 to 6, a modular circuit device 100 in accordance with a first preferred embodiment of the invention comprises a first circuit module 10 including a circuit board 11, a first bridge member 12, and a first bridge element 13. The circuit board 11 includes a substrate 111, a female header 112, and a pin header 113. The substrate 111 is a printed circuit board (PCB) having electronic components embedded therein. In detail, the substrate 111 includes a plurality of electronic components 15, a first projection 114 at first end with the female header 112 disposed thereon, a second projection 115 at a second end with the pin header 113 disposed thereon, two first through holes 116 between the female header 112 and the electronic components 15, and two second through holes 117 between the pin header 113 and the electronic components 15. The female header 112 is electrically connected to the substrate 111 and the pin header 113 is also electrically connected to the substrate 111.

The first bridge member 12 is integrally formed of a non-conductive substrate such as plastic in the embodiment. The first bridge member 12 includes a recess 121 on a bottom, two cavities 122 on two sides of the recess 121 respectively, two pegs 123 in the recess 121, a socket 124 on first end of the first bridge member 12, two grooves 125 on two sides of the bottom of the first bridge member 12 respectively, two spaced, slotted protrusions 126 on a top of the first bridge member 12, a first trough 127 on one side of the first bridge member 12 above one of the grooves 125, a slotted protuberance 128 on one side of the first bridge member 12 above the first trough 127, a second trough 29 on the other side of the first bridge member 12, and a slotted projecting member 120 on the other side of the first bridge member 12 under the second trough 129. The first projection 114 and the female header 112 are disposed in the recess 121 with two sides of the first projection 114 disposed in the cavities 122 respectively, and electrically interconnect the first bridge member 12 and the circuit board 11. Also, the pegs 123 are inserted into the first through holes 116 to secure the first bridge member 12 to the circuit board 11.

The first bridge element 13 is integrally formed of a non-conductive substrate such as plastic in the embodiment. The first bridge element 13 includes a recess 131 on a bottom, two cavities 132 on two sides of the recess 131 respectively, two pegs 133 in the recess 131, a projecting element 134 at a second end of the first bridge element 13, two grooves 135 on two sides of the bottom of the first bridge element 13 respectively, two spaced, slotted protrusions 136 on a top of the first bridge element 13, a first trough 137 on one side of the first bridge element 13 above one of the grooves 135, a slotted protuberance 138 on one side of the first bridge element 13 under the first trough 137, a second trough 139 on the other side of the first bridge element 13 above the other groove 135, and a slotted projecting member 130 on the other side of the first bridge element 13 above the second trough 139. The second projection 115 and the pin header 113 are disposed in the recess 131 with two sides of the second projection 115 disposed in the cavities 132 respectively. Also, the pegs 133 are inserted into the second through holes 117 to secure the first bridge element 13 to the circuit board 11.

Above is a detailed description of components and assembly of the modular circuit device 100 of the first preferred embodiment. It is envisaged by the invention that the pin header 113 of one first circuit module 10 can be inserted into the female header 112 of another first circuit module 10 to electrically connect two first circuit modules 10 together.

Figure 5:
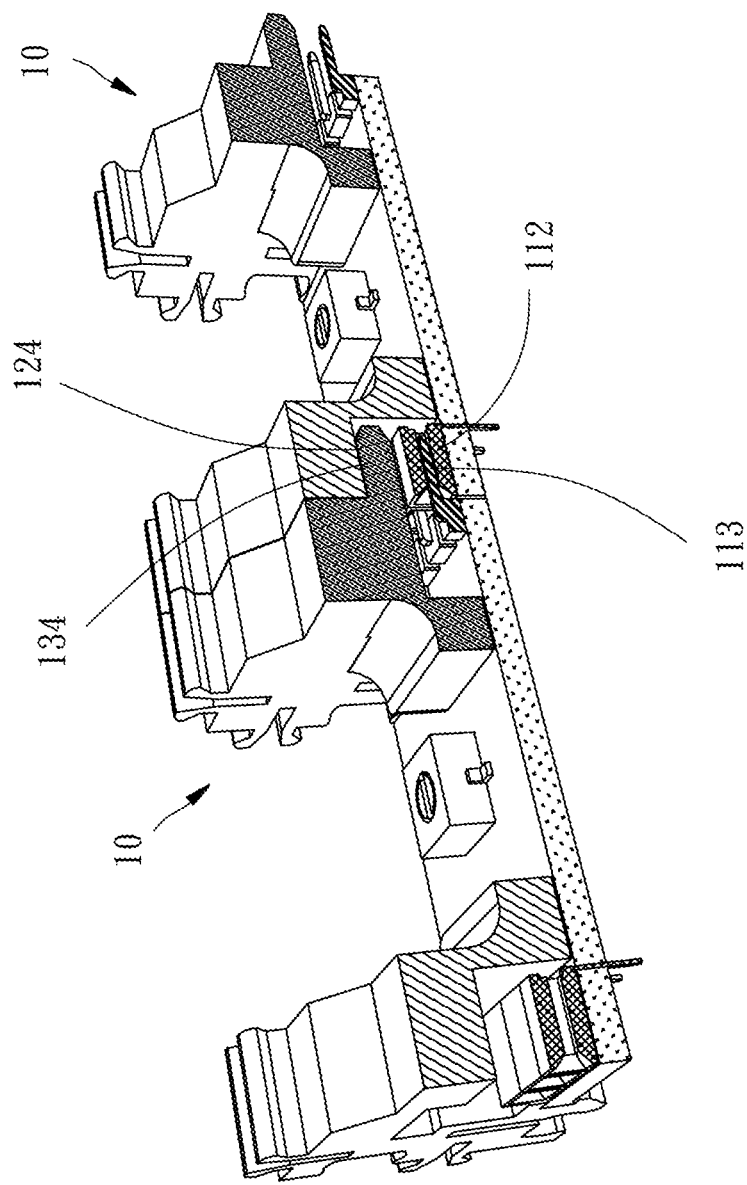
FIG. 5 is a perspective view in part section of a portion of two assembled first circuit modules.

As shown in FIG. 5 specifically, in one configuration the projecting element 134 of one first circuit module 10 is inserted into the socket 124 of another first circuit module 10 to fasten two first circuit modules 10 together. Also, the pin header 113 of one first circuit module 10 is inserted into the female header 112 of another first circuit module 10 to electrically connect the two first circuit modules 10 together.

Figure 6:
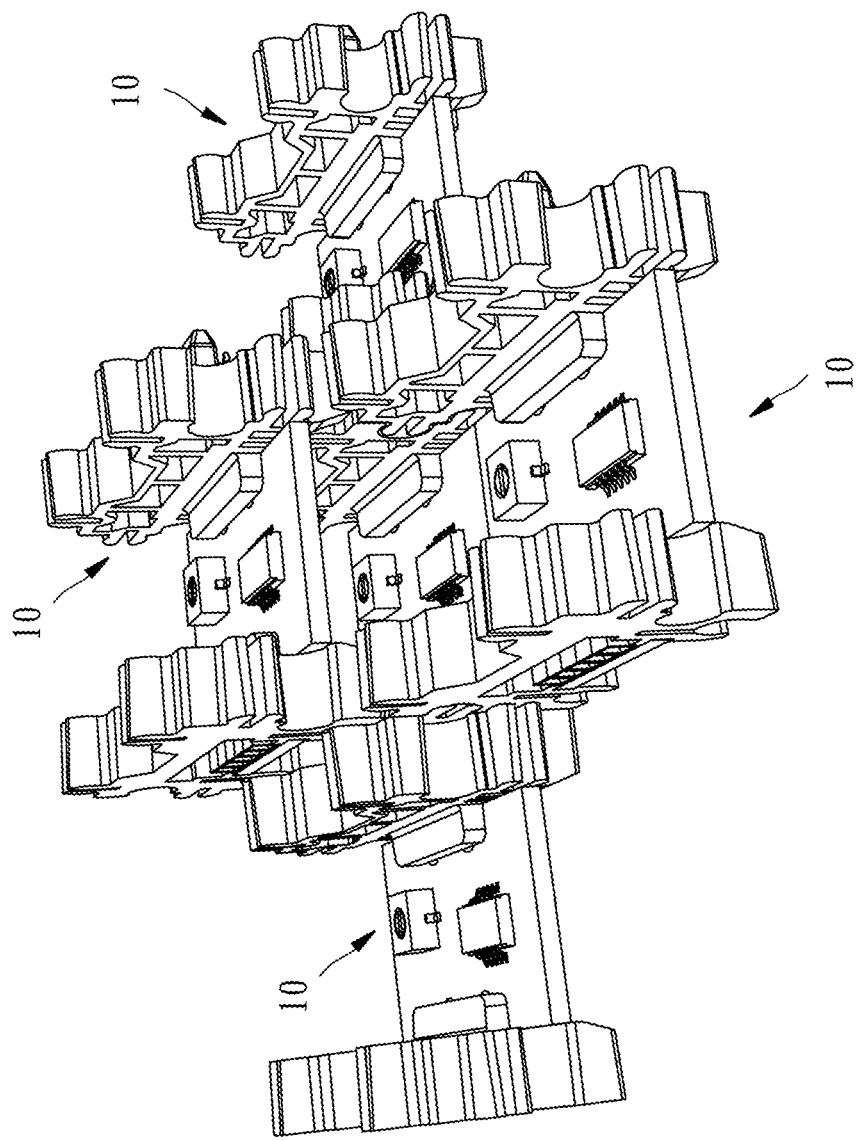
FIG. 6 is a perspective view of an assembly consisting of five first circuit modules.

As shown in FIG. 6 specifically, in another configuration three first circuit modules 10 are connected in a row, a fourth first circuit module 10 is disposed on top of the intermediate first circuit module 10 of the three first circuit modules 10, and a fifth first circuit module 10 is disposed to one side of the intermediate first circuit module 10. It is seen that assembly of a plurality of the first circuit modules 10 in a top-down direction, a front-rear direction, or transverse direction is easy and simple. In detail, a slot 14 is formed on each of the slotted protrusions 126, the slotted protuberance 128, the slotted projecting member 120, the slotted protrusions 136, the slotted protuberance 138, and the slotted projecting member 130 respectively. The slot 14 can be compressed in response to a force exerted on one of the above slotted components, for example, the slotted protrusions 126 of one first circuit module 10 inserted into the grooves 125 of another first circuit module 10, thereby fastening two adjacent first circuit modules 10 together.

Figure 7:
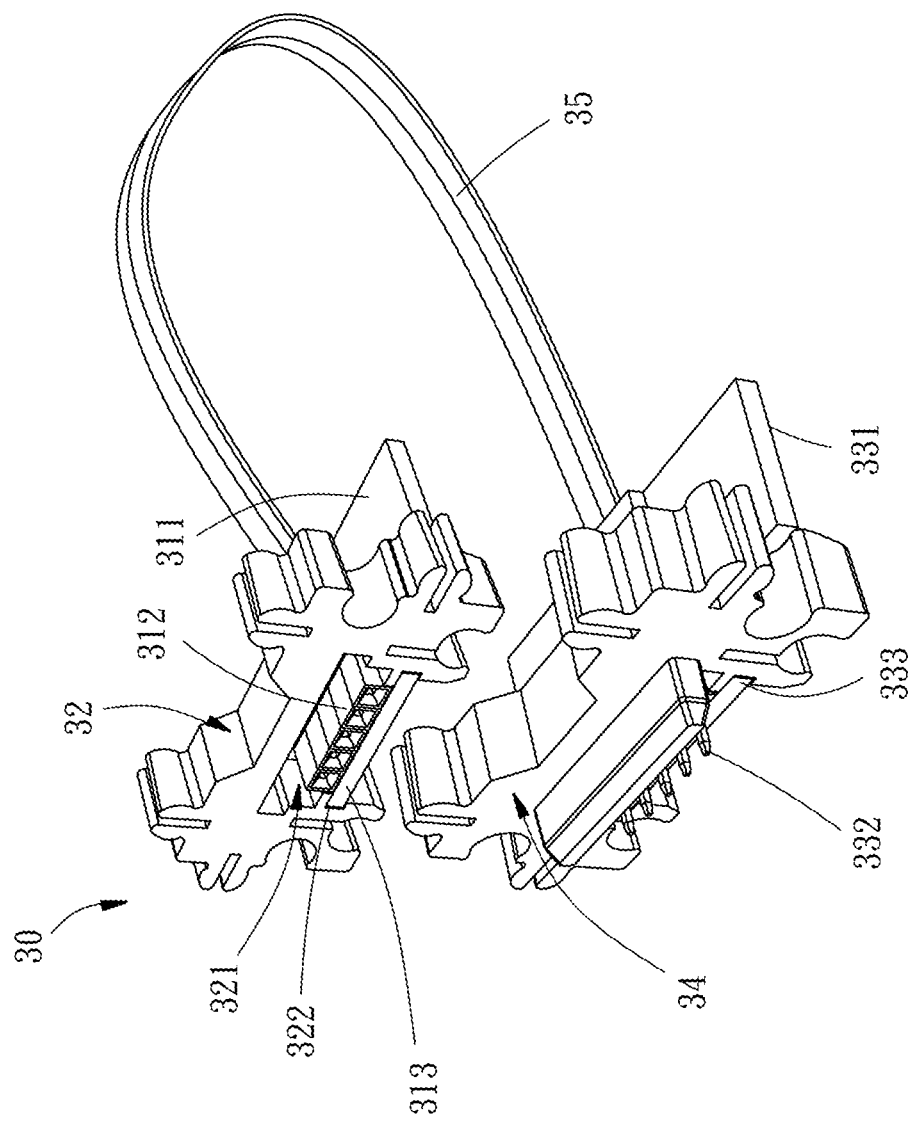
FIG. 7 is a perspective view of an electrical connection assembly of a modular circuit device according to a second preferred embodiment of the invention.
Figure 8A:
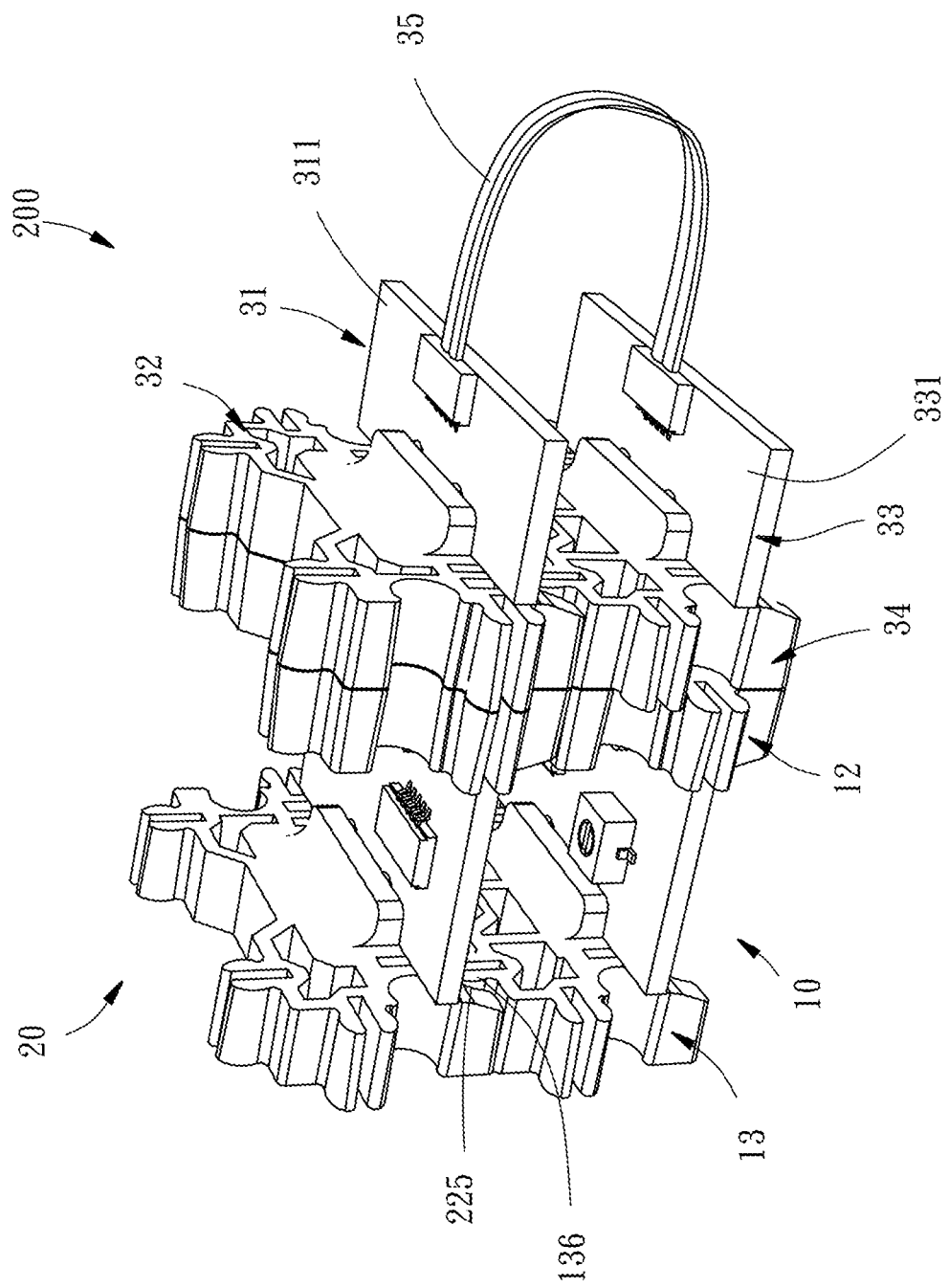
FIG. 8A is a perspective view of the modular circuit device according to the first preferred embodiment.
Figure 8B:
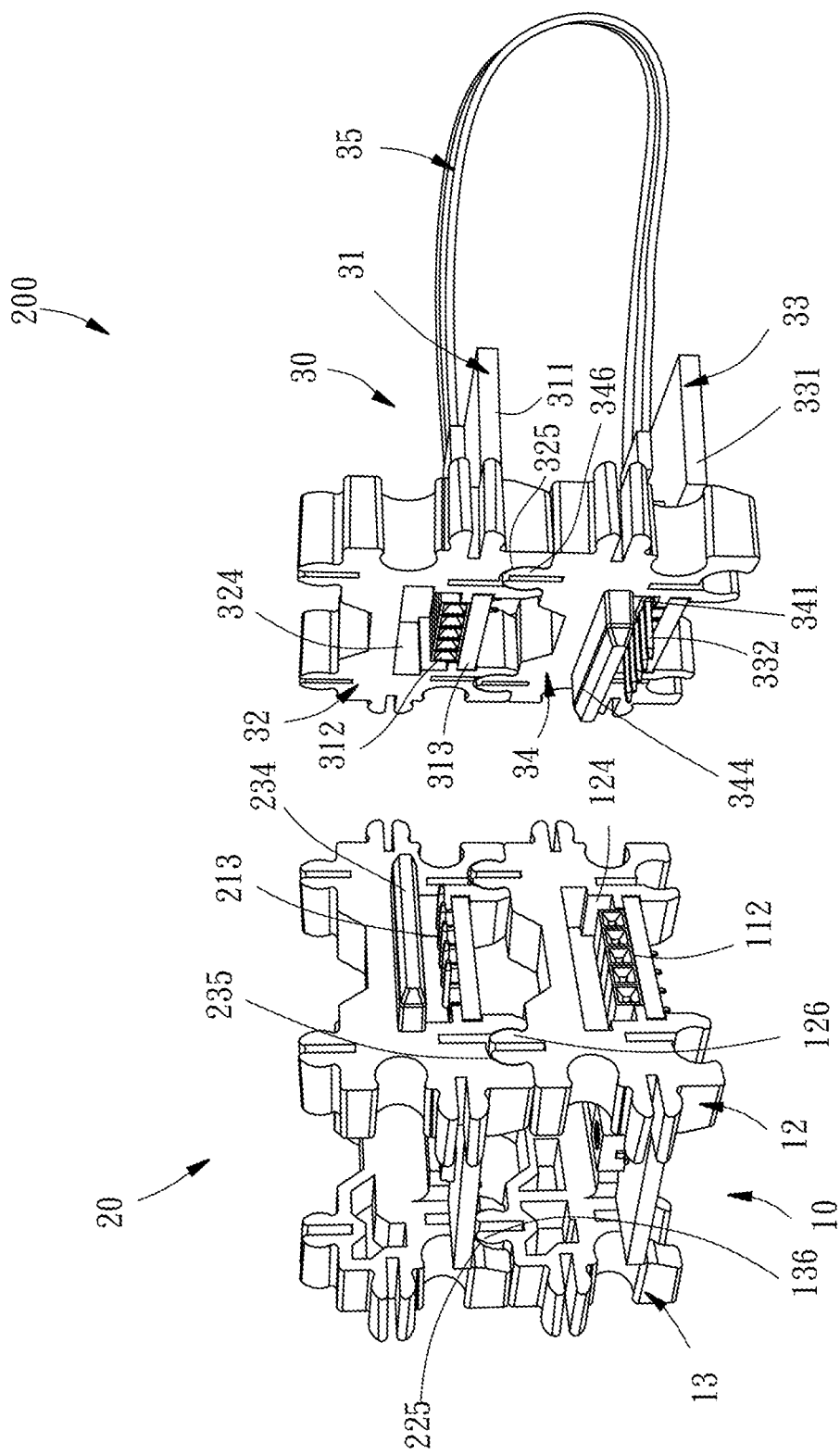
FIG. 8B is an exploded perspective view of the modular circuit device shown in FIG. 8A.

Referring to FIGS. 7, 8A and 8B, a modular circuit device 200 of a second preferred embodiment of the invention is shown. The characteristics of the second preferred embodiment are discussed below. A second circuit module 20 is identical to the first circuit module 10 and thus a detailed description of its components is omitted herein for the sake of brevity. The slotted protrusions 126 of the first circuit module 10 are inserted into the grooves 125 of the second circuit module 20 and the slotted protrusions 136 of the first circuit module 10 are inserted into the grooves 225 of the second circuit module 20, thereby disposing the second circuit module 20 on the first circuit module 10. An electrical connection assembly 30 includes a cable 35, a first conductive assembly 31 including a conductive board 311 electrically connected to first end of the cable 35, a projecting part 313 at an end of the conductive board 311, and a female header 312 on the projecting part 313 and electrically connected to the conductive board 311, a second conductive assembly 33 including a conductive board 331 electrically connected to a second end of the cable 35, a projecting part 333 at an end of the conductive board 331, and a pin header 332 on the projecting part 333 and electrically connected to the conductive board 331, a second bridge member 32 being identical to the first bridge member 12 and disposed on the first conductive assembly 31, and a second bridge element 34 being identical to the first bridge element 13. The projecting part 313 and the female header 312 of the first conductive assembly 31 are disposed in a recess 321 of the second bridge member 32 with two sides of the projecting part 313 disposed in two cavities 322 of the second bridge member 32 respectively. The projecting part 333 and the pin header 332 of the second conductive assembly 33 are disposed in a recess 341 of the second bridge element 34. The slotted protrusions 126 are inserted into the grooves 235 of the second circuit module 20 and the slotted protrusions 136 are inserted into the grooves 225 of the second circuit module 20, thereby fastening the first circuit module 10 and the second circuit module 20 together. A projecting element 344 of the second bridge element 34 is inserted into the socket 124 of the first circuit module 10, and a projecting element 234 of the second circuit module 20 is inserted into a socket 324 of the second bridge member 32 to fasten the electrical connection assembly 30, the first circuit module 10, and the second circuit module 20 together. Also, the pin header 332 of the second conductive assembly 33 is inserted into the female header 112 of the first circuit module 10, and the pin header 213 of the second circuit module 20 is inserted into the female header 312 of the first conductive assembly 31 to electrically interconnect the electrical connection assembly 30, the first circuit module 10, and the second circuit module 20.

Figure 9A:
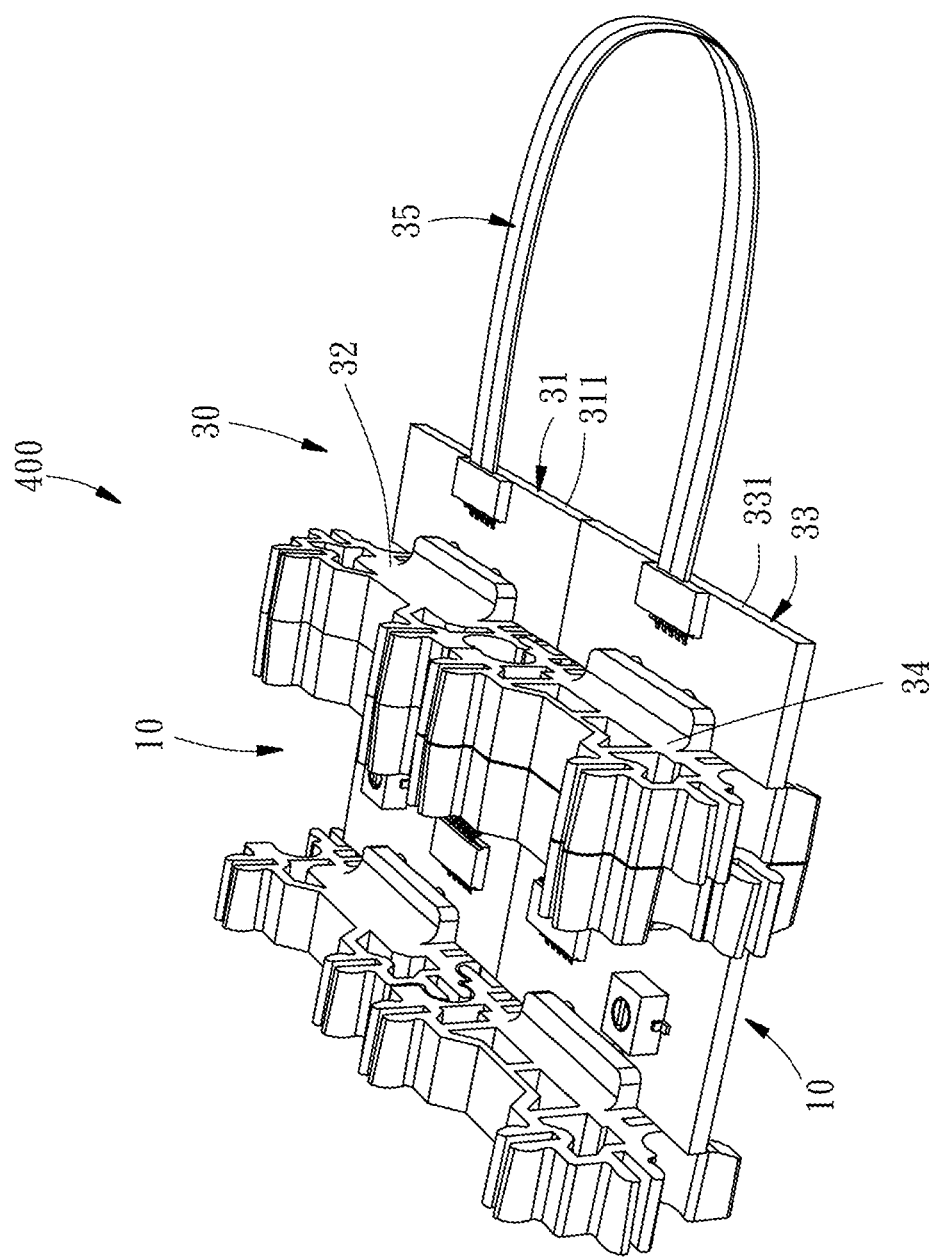
FIG. 9A is a perspective view of a modular circuit device according to a third preferred embodiment of the invention.
Figure 9B:
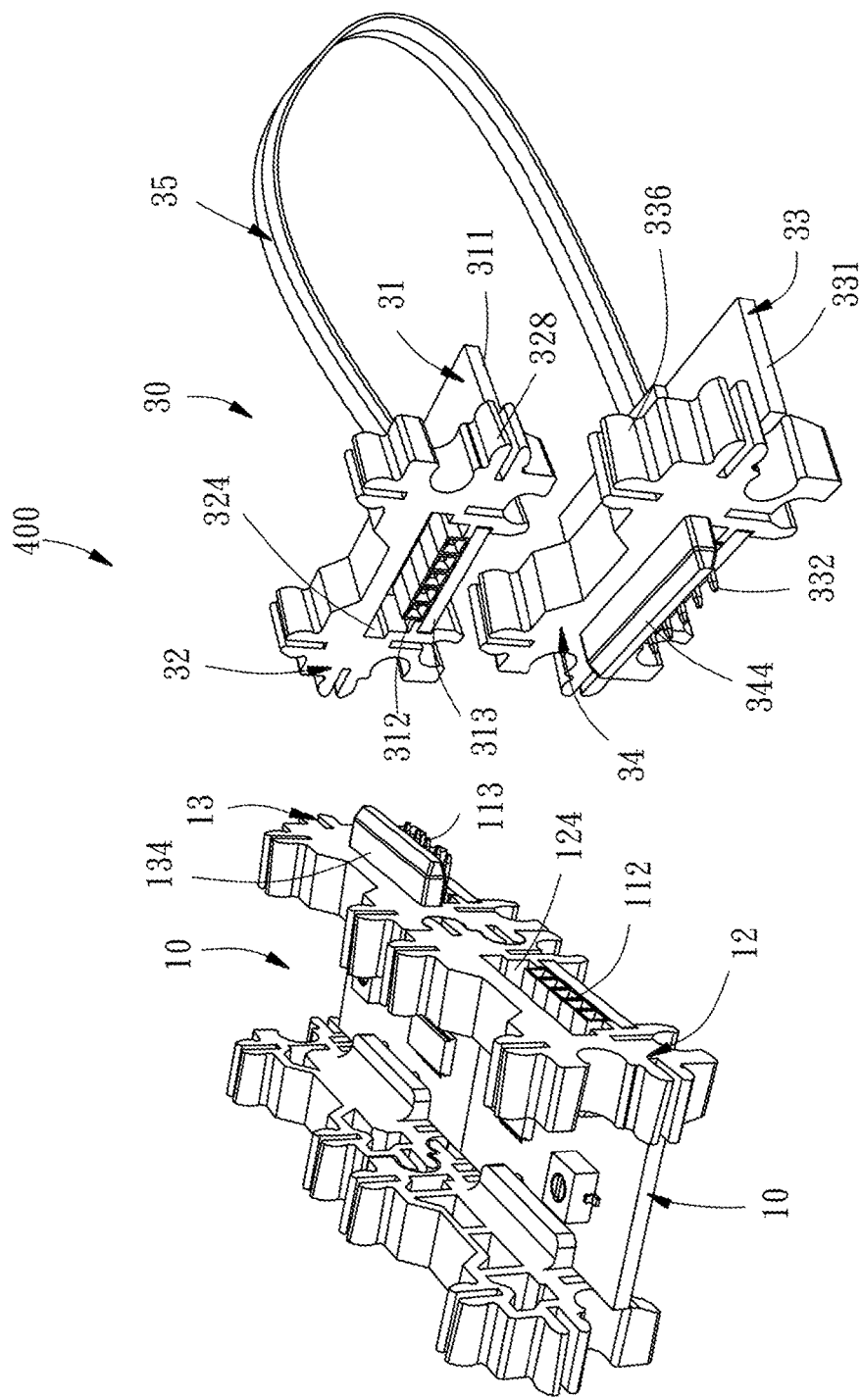
FIG. 9B is an exploded perspective view of the modular circuit device shown in FIG. 9A.
Figure 10:
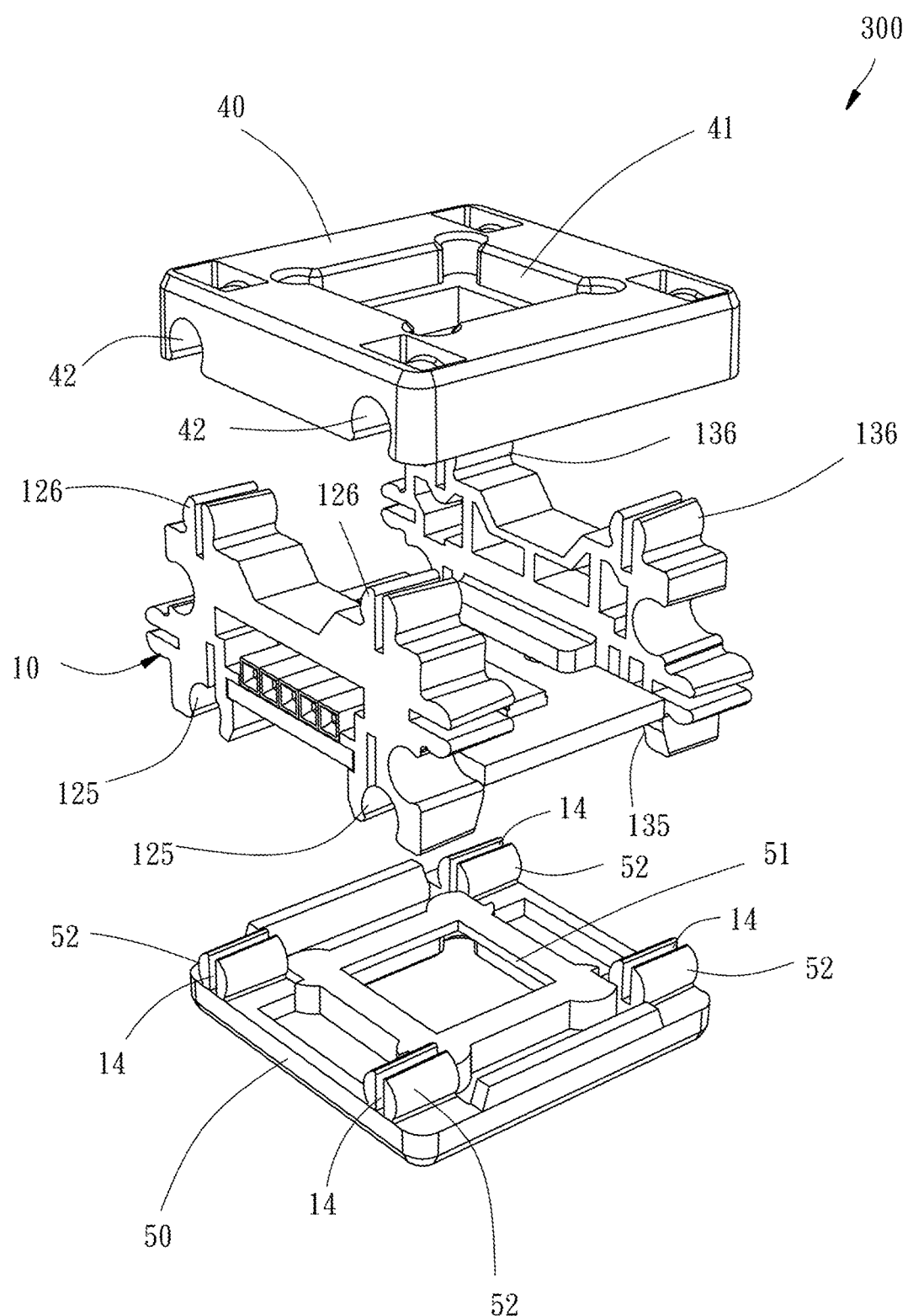
FIG. 10 is an exploded perspective view of a modular circuit device according to a fourth preferred embodiment of the invention.
Figure 11:
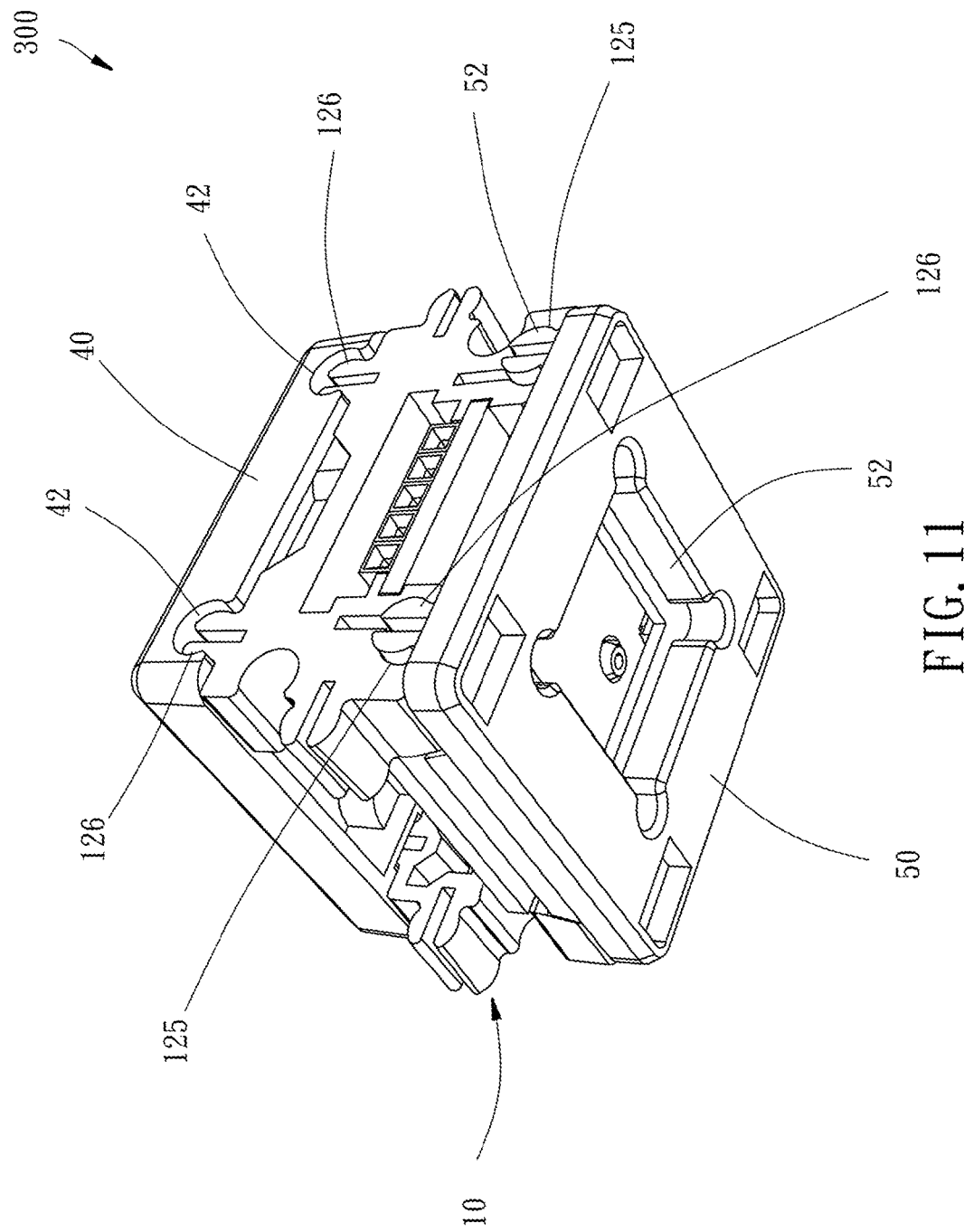
FIG. 11 is a perspective view of the assembled modular circuit device shown in FIG. 10.
Figure 12:
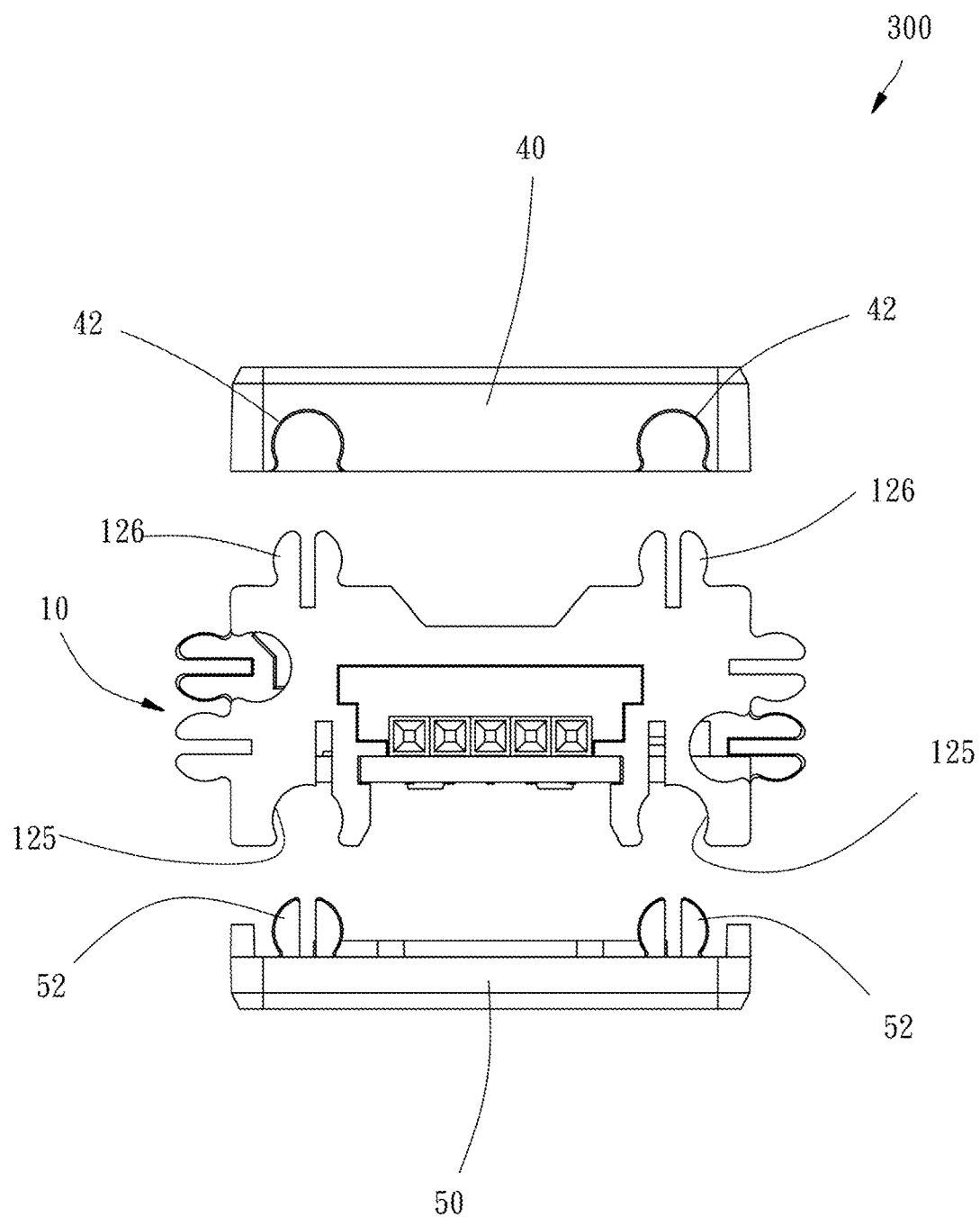
FIG. 12 is a side elevation of the modular circuit device shown in FIG. 10.

Referring to FIGS. 9A and 9B, a modular circuit device 400 of a third preferred embodiment of the invention is shown. The characteristics of the third preferred embodiment are discussed below. Components of the third preferred embodiment are comprised of two first circuit modules 10 and an electrical connection assembly 30. The first circuit modules 10 are connected side-by-side with opposite orientations. The pin header 113 of one of the first circuit modules 10 is inserted into the female header 312 of the first conductive assembly 31, the projecting element 134 of one first circuit module 10 is inserted into the socket 324 of the second bridge member 32, the pin header 332 of the second conductive assembly 33 is inserted into the female header 112 of the other first circuit module 10, the projecting element 344 of the second bridge element 34 is inserted into the socket 124 of the other circuit module 10, and the slotted protuberance 328 the second bridge member 32 is inserted into the first trough 347 of the second bridge element 34. As a result, the first circuit modules 10 and the electrical connection assembly 30 are fastened together and electrically connected together.

Referring to FIGS. 10 to 13, a modular circuit device 300 of a fourth preferred embodiment of the invention is shown. The characteristics of the fourth preferred embodiment are discussed below. A parallelepiped cover 40 is integrally formed of plastic and includes a central through hole 41 of rectangular section, and four grooves 42 on bottoms of four corners respectively. A parallelepiped base 50 is integrally formed of plastic and includes a central through hole 51 of rectangular section, four slotted projections 52 on tops of four corners respectively, and four slots 14 formed in the slotted projections 52 respectively.

In assembly, the slotted projections 52 are inserted into the grooves 125, and the slotted protrusions 126 are inserted into the grooves 42. Two external components can be disposed on the central through holes 41 and 51 respectively. The first circuit module 10 is protected by both the cover 40 and the base 50. The slot 14 can be compressed in response to a force exerted on one of the above slotted components, for example, the slotted projection 52, thereby fastening the first circuit module 10 and the base 50 together. The slotted protrusions 126 facilitate the fastening of the first circuit module 10 and the cover 40.

The characteristics and advantages of the invention are briefed below. The female header 112, the pin header 113, the first bridge member 12, and the first bridge element 13 are disposed on the substrate 111 of the circuit board 11. Small relative movement or displacement of the first bridge member 12 or the first bridge element 13 does not adversely affect the positioning of both the female header 112 and the pin header 113 on the circuit board 11 and the electrical connection of both the female header 112 and the pin header 113 to the circuit board 11. This ensures a reliable electrical connection of the modular circuit device of the invention. Both the first bridge member 12 and the first bridge element 13 are integrally formed. Both the female header 112 and the pin header 113 are provided on the substrate 111. This can decrease both the number of components and the manufacturing cost. An easy and fast assembly is made possible. Finally, use is convenient.

Although the present invention has been described with reference to the foregoing preferred embodiments, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A modular circuit device comprising:
a first circuit module including a circuit board, a first bridge member, and a first bridge element;
wherein the circuit board includes a substrate, a female header, and a pin header;
wherein the substrate includes a first projection at a first end with the female header disposed thereon, and a second projection at a second end with the pin header disposed thereon;
wherein the first bridge member is integrally formed of a non-conductive substrate;
wherein the first bridge member includes a recess on a bottom, two cavities on two sides of the recess respectively, and a socket on a first end of the first bridge member;
wherein the first bridge element is integrally formed of a non-conductive substrate;
wherein the first bridge element includes a recess on a bottom, two cavities on two sides of the recess respectively, and a projecting element at a second end of the first bridge element; and
wherein the first projection of the substrate is disposed in the cavities of the first bridge member, the female header of the circuit board is disposed in the recess of the first bridge member, the second projection of the substrate is disposed in the cavities of the first bridge element, and the pin header of the circuit board is disposed in the recess of the first bridge element.

2. The modular circuit device of claim 1, wherein the substrate is a printed circuit board having electronic components embedded therein, and wherein the first projection is at the first end of the substrate, the second projection is at a second end of the substrate, the female header is electrically connected to the substrate, and the pin header is electrically connected to the substrate.

3. The modular circuit device of claim 1, wherein the substrate further comprises at least one first through hole and at least one second through hole, wherein the first bridge member further comprises at least one peg disposed in the recess thereof and inserted into the first through hole, and wherein the first bridge element further comprises at least one peg disposed in the recess thereof and inserted into the second through hole.

4. The modular circuit device of claim 1, wherein the first bridge member further comprises two grooves on two sides of a bottom thereof respectively, and two protrusions on two sides of a top thereof respectively; wherein the first bridge element further comprises two grooves on two sides of a bottom thereof respectively, and two protrusions on a top thereof respectively; and wherein the grooves of the first and first bridge elements of a first one of the first circuit modules are placed on the protrusions of the first and first bridge elements of a second one of the first circuit modules thereunder when the first and second ones of the first circuit modules are stacked.

5. The modular circuit device of claim 4, further comprising a parallelepiped cover including a central through hole and four grooves on bottoms of four corners respectively, the grooves being configured to place on the protrusions of the first bridge member and the protrusions of the first bridge element respectively.

6. The modular circuit device of claim 4, further comprising a parallelepiped base including a central through hole and four projections on tops of four corners respectively, the projections being configured to insert into the grooves of the first bridge member and the grooves of the first bridge element respectively.

7. The modular circuit device of claim 4, further comprising:
a second circuit module including a circuit board, a first bridge member, and a first bridge element; wherein the circuit board includes a substrate, a female header, and a pin header; wherein the substrate includes a first projection at a first end with the female header disposed thereon, and a second projection at the second end with the pin header disposed thereon; wherein the first bridge member includes a recess on a bottom, two cavities on two sides of the recess respectively, and a socket on a first end of the first bridge member; wherein the first bridge element includes a recess on a bottom, two cavities on two sides of the recess respectively, and a projecting element at the second end of the first bridge element; wherein the first projection of the substrate is disposed in the cavities of the first bridge member, the female header of the circuit board is disposed in the recess of the first bridge member, the second projection of the substrate is disposed in the cavities of the first bridge element, and the pin header of the circuit board is disposed in the recess of the first bridge element; and wherein the protrusions of the first circuit module are inserted into the grooves of the second circuit module and the protrusions of the first circuit module are inserted into the grooves of the second circuit module, thereby disposing the second circuit module on the first circuit module; and an electrical connection assembly including a cable; a first conductive assembly including a conductive board electrically connected to a first end of the cable, a projecting part at a first end of the conductive board, and a female header on the projecting part and electrically connected to the conductive board; a second conductive assembly including a conductive board electrically connected to a second end of the cable, a projecting part at a first end of the conductive board thereof, and a pin header on the projecting part thereof and electrically connected to the conductive board thereof; a second bridge member mounted on the first conductive assembly; and a second bridge element wherein the projecting part and the female header of the first conductive assembly are disposed in a recess of the second bridge member with two sides of the projecting part disposed in two cavities of the second bridge member respectively; wherein the projecting part and the pin header of the second conductive assembly are disposed in a recess of the second bridge element; the protrusions of the first circuit module are inserted into the grooves of the second circuit module and the protrusions of the first circuit module are inserted into the grooves of the second circuit module, thereby fastening the first circuit module and the second circuit module together; wherein a projecting element of the second bridge element is inserted into the socket of the first circuit module; wherein a projecting element of the second circuit module is inserted into a socket of the second bridge member to fasten the electrical connection assembly, the first circuit module, and the second circuit module together; wherein the pin header of the second conductive assembly is inserted into the female header of the first circuit module; and wherein the pin header of the second circuit module is inserted into the female header of the first conductive assembly to electrically interconnect the electrical connection assembly, the first circuit module, and the second circuit module.

8. The modular circuit device of claim 7, wherein the first conductive assembly has electronic components embedded therein, the projecting part of the first conductive assembly are disposed in two cavities of the second bridge member respectively, and the female header of the first conductive assembly is disposed on the projecting part of the first conductive assembly and is electrically connected to the first conductive assembly; and wherein the second conductive assembly has electronic components embedded therein, the projecting part of the second conductive assembly are disposed in two cavities of the second bridge element respectively, and the female header of the first conductive assembly is disposed on the projecting part of the second conductive assembly and is electrically connected to the second conductive assembly.

9. The modular circuit device of claim 7, wherein the first conductive assembly includes at least one first positioning hole, and the second bridge member includes at least one peg inserted into the at least one first positioning hole respectively; and wherein the second conductive assembly includes at least one second positioning hole, and the second bridge element includes at least one peg inserted into the at least one second positioning hole respectively.

10. The modular circuit device of claim 1, wherein the first bridge member further comprises a first trough on one side, a protuberance on one side above the first trough, a second trough on the other side, and a projecting member on the other side under the second trough; wherein the first bridge element further comprises a first trough on one side, a protuberance on one side under the first trough thereof, a second trough on the other side, and a projecting member on the other side above the second trough thereof; and wherein the protuberance and the projecting member of a first one of the first circuit modules are disposed in the first and second troughs of a second one of the first circuit modules respectively when the first and second ones of the first circuit modules are assembled in a front to rear arrangement.

11. The modular circuit device of claim 10, further comprising an electrical connection assembly including a cable; a first conductive assembly including a conductive board electrically connected to a first end of the cable, a projecting part at a first end of the conductive board, and a female header on the projecting part and electrically connected to the conductive board; a second conductive assembly including a conductive board electrically connected to a second end of the cable, a projecting part at a first end of the conductive board thereof, and a pin header on the projecting part thereof and electrically connected to the conductive board thereof; a second bridge member mounted on the first conductive assembly; and a second bridge element wherein the projecting part and the female header of the first conductive assembly are disposed in a recess of the second bridge member with two sides of the projecting part disposed in two cavities of the second bridge member respectively; wherein the projecting part and the pin header of the second conductive assembly are disposed in a recess of the second bridge element; the protrusions of the first circuit module are inserted into the grooves of the second circuit module and the protrusions of the first circuit module are inserted into the grooves of the second circuit module, thereby fastening the first circuit module and the second circuit module together; wherein a projecting element of the second bridge element is inserted into the socket of the first circuit module; wherein a projecting element of the second circuit module is inserted into a socket of the second bridge member to fasten the electrical connection assembly, the first circuit module, and the second circuit module together; wherein the pin header of the second conductive assembly is inserted into the female header of the first circuit module; and wherein the pin header of the second circuit module is inserted into the female header of the first conductive assembly to electrically interconnect the electrical connection assembly, the first circuit module, and the second circuit module.

12. The modular circuit device of claim 1, wherein the number of the first circuit modules is two and each of the first circuit modules includes a circuit board, a first bridge member, and a first bridge element; wherein the circuit board includes a substrate, a female header, and a pin header; wherein the substrate includes a first projection at a first end with the female header disposed thereon, and a second projection at a second end with the pin header disposed thereon; wherein the first bridge member is integrally formed of a non-conductive substrate; wherein the first bridge member includes a recess on a bottom, two cavities on two sides of the recess respectively, and a socket on a first end of the first bridge member; wherein the first bridge element is integrally formed of a non-conductive substrate; wherein the first bridge element includes a recess on a bottom, two cavities on two sides of the recess respectively, and a projecting element at a second end of the first bridge element; and wherein the first projection of the substrate is disposed in the cavities of the first bridge member, the female header of the circuit board is disposed in the recess of the first bridge member, the second projection of the substrate is disposed in the cavities of the first bridge element, and the pin header of the circuit board is disposed in the recess of the first bridge element;

further comprising an electrical connection assembly including a cable; a first conductive assembly including a conductive board electrically connected to a first end of the cable, a projecting part at a first end of the conductive board, and a female header on the projecting part and electrically connected to the conductive board; a second conductive assembly including a conductive board electrically connected to a second end of the cable, a projecting part at a first end of the conductive board thereof, and a pin header on the projecting part thereof and electrically connected to the conductive board thereof; a second bridge member mounted on the first conductive assembly; and a second bridge element wherein the projecting part and the female header of the first conductive assembly are disposed in a recess of the second bridge member with two sides of the projecting part disposed in two cavities of the second bridge member respectively; wherein the projecting part and the pin header of the second conductive assembly are disposed in a recess of the second bridge element; the protrusions of the first circuit module are inserted into the grooves of the second circuit module and the protrusions of the first circuit module are inserted into the grooves of the second circuit module, thereby fastening the first circuit module and the second circuit module together; wherein a projecting element of the second bridge element is inserted into the socket of the first circuit module; wherein a projecting element of the second circuit module is inserted into a socket of the second bridge member to fasten the electrical connection assembly, the first circuit module, and the second circuit module together; wherein the pin header of the second conductive assembly is inserted into the female header of the first circuit module; and wherein the pin header of the second circuit module is inserted into the female header of the first conductive assembly to electrically interconnect the electrical connection assembly, the first circuit module, and the second circuit module.

13. The modular circuit device of claim 1, wherein the socket of a first one of the first circuit modules is placed on the projecting element of a second one of the first circuit modules, and the pin header of the first one of the first circuit modules is inserted into the female header of the second one of the first circuit modules when the first and second ones of the first circuit modules assembled side by side.

* * * * *